(12) United States Patent
Derix

(10) Patent No.: US 10,985,303 B2
(45) Date of Patent: Apr. 20, 2021

(54) METHOD OF MAKING AN LED DEVICE

(71) Applicant: Lumileds LLC, San Jose, CA (US)

(72) Inventor: Robert Derix, Aachen (DE)

(73) Assignee: Lumileds LLC, San Jose, CA (US)

( * ) Notice: Subject to any disclaimer, the term of this patent is extended or adjusted under 35 U.S.C. 154(b) by 105 days.

(21) Appl. No.: 15/756,756

(22) PCT Filed: Aug. 26, 2016

(86) PCT No.: PCT/EP2016/070168
§ 371 (c)(1),
(2) Date: Mar. 1, 2018

(87) PCT Pub. No.: WO2017/036946
PCT Pub. Date: Mar. 9, 2017

(65) Prior Publication Data
US 2018/0254399 A1 Sep. 6, 2018

(30) Foreign Application Priority Data
Sep. 3, 2015 (EP) .................................... 15183612

(51) Int. Cl.
*H01L 33/64* (2010.01)
*H05K 1/02* (2006.01)
*H05K 1/18* (2006.01)
*H05B 45/00* (2020.01)
*F21V 8/00* (2006.01)

(52) U.S. Cl.
CPC ............ *H01L 33/64* (2013.01); *G02B 6/0023* (2013.01); *H05B 45/00* (2020.01); *H05K 1/0204* (2013.01); *H05K 1/184* (2013.01); *H05K 2201/10106* (2013.01); *H05K 2203/06* (2013.01); *H05K 2203/063* (2013.01)

(58) Field of Classification Search
CPC ... H01L 33/64; G02B 6/0023; H05B 33/0806; H05K 1/0204
USPC ..................................... 257/98–103; 438/103
See application file for complete search history.

(56) References Cited

U.S. PATENT DOCUMENTS 10,779,413 B2 9/2020 Schwarz et al.
2005/0180111 A1 8/2005 Barnesberger et al.
(Continued)

FOREIGN PATENT DOCUMENTS

DE 112012004593 T5 8/2014
JP 2005123477 A 5/2005
(Continued)

OTHER PUBLICATIONS

EPO as ISA, "International Search Report and Written Opinion" dated Nov. 8, 2016 from International Application No. PCT/EP2016/070168, filed Aug. 26, 2016, 21 pages.
(Continued)

Primary Examiner — Lynne A Gurley
Assistant Examiner — Vernon P Webb

(57) ABSTRACT

A thermally efficient, cost efficient and compact LED device having an LED module and a circuit board. The LED module having an LED substrate and an LED chip mounted on a mounting surface of the LED substrate. The circuit board is composed of a circuit board substrate and has a plurality of conductive tracks on a surface of the circuit board substrate. The LED substrate is embedded in the circuit board substrate.

9 Claims, 4 Drawing Sheets

(56) References Cited

U.S. PATENT DOCUMENTS

| | | | |
|---|---|---|---|
| 2007/0223226 A1* | 9/2007 | Park | H01L 25/0753 362/267 |
| 2010/0001305 A1* | 1/2010 | Lin | H01L 24/82 257/99 |
| 2012/0329183 A1 | 12/2012 | Wang | |
| 2013/0215610 A1 | 8/2013 | Tsai et al. | |
| 2016/0150643 A1 | 5/2016 | Lee | |

FOREIGN PATENT DOCUMENTS

| | | |
|---|---|---|
| JP | 2007214162 A | 8/2007 |
| KR | 20160012731 A | 2/2016 |
| WO | 2015085342 A1 | 6/2015 |

OTHER PUBLICATIONS

Extended European Search Report dated Mar. 22, 2016 from European Patent Application No. 15183612.9 filed Sep. 3, 2015, 7 pages.

* cited by examiner

METHOD OF MAKING AN LED DEVICE

CROSS-REFERENCE TO RELATED APPLICATIONS

The present application is a § 371 application of International Application No. PCT/EP2016/070168 filed on Aug. 26, 2016 and titled "METHOD OF MAKING AN LED DEVICE," which claims the benefit of European Patent Application No. 15183612.9 filed on Sep. 3, 2015. International Application No. PCT/EP2016/070168 and European Patent Application No. 15183612.9 are incorporated herein.

FIELD OF THE INVENTION

This invention relates to an LED (Light Emitting Diode) device, for example an LED lighting unit.

BACKGROUND OF THE INVENTION

An important factor that underpins the performance of an LED device is the thermal management of the LED device. As LED technology has progressed the brightness level of LEDs has increased. Consequently, the ability of an LED device to dissipate heat generated by an LED has become increasingly important.

Devices manufactured using surface mount technology are known as surface mount devices (SMDs), in which electronic components are mounted directly onto the surface of a printed circuit board (PCB). Producing electronic devices in this way offers numerous advantages such as low production costs, high component density and compact design. However, the thermal load generated by an LED mounted to a circuit board surface in this way is typically conducted through the body of the circuit board. This requires that the PCB on which the LED is mounted is constructed from high performance materials specifically chosen for their ability to effectively conduct heat through the PCB. For example, a PCB suitable for use in a surface mount device may be a metal core PCB (MCPCB) also known as insulated metal substrate (IMS) made of a metal core and thermally conductive but electrically insulating dielectric layers or "classical" PCB materials (FR4, BT) with additional measures like thermal vias. The choice of circuit board material is restricted by the requirement that the circuit board dissipates heat generated by the LED and suitable materials are expensive. As a consequence, manufacturing high performance LED devices is costly.

To avoid the high cost associated with surface mounted LEDs, an alternative arrangement may be used, in which a heat sink (or in general, a package or interposer) is provided between the LED and the mounting surface of the PCB. In this arrangement, the LED is connected to the electronic circuit of the PCB by bond wires which extend from the LED chip to the surface of the circuit board. In another arrangement, vias are provided through the package or interposer to connect the LED chip to the PCB. In this way a surface mount device is provided.

US 2012/0329183 A1 discloses a manufacturing method of a printing circuit board including: providing layers of copper and prepegs; manufacturing one or more mounting holes in the copper and prepegs layers; laminating and pressing the copper and the prepegs layers; forming one or more cylindrical micro-radiators; mounting a LED chip on the cylindrical micro-radiators; and, after laminating the copper and prepeg layers, embedding the cylindrical micro-radiators into the mounting holes.

There is therefore a need for a design which allows simple connection to the LED, which also enables good thermal management even with a low cost PCB and that is simple to manufacture.

SUMMARY OF THE INVENTION

The invention is defined by the claims.

There is provided an LED device comprising:

an LED module comprising an LED substrate and an LED chip mounted on a mounting surface of the LED substrate; and a circuit board comprising a circuit board substrate and a plurality of conductive tracks on a first surface of the circuit board substrate, wherein the circuit board substrate comprises a receiving portion adapted to receive the LED substrate; and wherein LED substrate is embedded in the circuit board substrate.

In this arrangement, a receiving portion of a circuit board is shaped to accommodate an LED substrate, allowing the LED device to be easily assembled by inserting the LED module into the circuit board. In the assembled LED device, the LED substrate of the LED module is integrated into the circuit board substrate with the mounting surface of the LED substrate, on which the LED chip is provided, being exposed. The conductive tracks are disposed on the first surface of the circuit board substrate to form a circuit, which the LED chip is connected to. The LED substrate is arranged within the circuit board substrate in such a way that the mounting surface of the LED substrate and the first surface of the circuit board substrate are in close proximity to one another. In this way, the LED chip can be easily connected to a conductive track disposed on the circuit board substrate, so that the LED chip is connected to the circuit. The LED substrate is of a material that provides good heat dissipation, so that heat generated by the LED chip is dissipated by the LED substrate. In this way the LED device is more cost efficient and achieves high thermal performance in a compact design.

The mounting surface of the LED substrate may be co-planar with the first surface of the circuit board substrate. In this way, the LED chip is provided in close proximity to the conductive tracks of the circuit board. Therefore, it is simple to provide an electrical connection between the LED chip and the circuit board. Additionally, the arrangement is compact.

The LED module may extend through the circuit board substrate. The LED receiving portion may thus be a cavity having a first cavity opening co-planar with the first surface of the circuit board substrate and a second cavity opening co-planar with a second surface of the circuit board substrate. The LED substrate may be thermally conductive so that heat generated by the LED chip is efficiently routed away from the LED module and circuit board by the LED substrate. As the LED substrate is capable of providing thermal management of the LED chip, the circuit board substrate need not be fabricated of material suitable for heat dissipation. Therefore, the circuit board may be made of inexpensive materials without compromising the performance of the LED device.

The circuit board substrate may comprise a second surface opposite to the first surface and the LED module may comprise a bottom surface opposite to the mounting surface, wherein the bottom surface and second surface define a heat dissipation surface of the LED device; and the LED device may further comprise a heat sink portion arranged to interface with the heat dissipation surface. In this way, heat generated by the LED chip is conducted through the LED substrate to the heat sink portion, which diffuses the heat generated by the LED chip, cooling the LED device. In this way, heat generated by the LED is routed through the LED substrate to the heat sink portion which is attached to the circuit board substrate. By providing this arrangement, the heat sink portion can be fixed to the circuit board substrate. Since the circuit board substrate may be of cheap and mechanically robust PCB material, the heat sink portion can be easily attached. For example, the heat sink portion can be screwed to the circuit board substrate. Alternatively, the heat sink portion can be clamped to the circuit board substrate. This may allow the LED device to be easily manufactured.

The LED module may further comprise a first contact portion and a second contact portion which are disposed on the mounting surface of the LED substrate, wherein the first contact portion is arranged to electrically connect the LED chip to a first conductive track of the circuit board and the second contact portion is arranged to electrically connect the LED chip to a second conductive track of the circuit board. The first and second contact portions may be positioned on the LED substrate such that when the LED module is positioned in the circuit board substrate, the first and second contact portions are aligned with the first and second conductive tracks of the circuit on the circuit board substrate, respectively. In this way, the LED chip may be electrically connected to the circuit.

The first contact portion may extend across a mounting surface of the LED substrate and may be positioned to align with the first conductive track of the circuit board and the second contact portion may extend across a mounting surface of the LED substrate and may be positioned to align with the second conductive track of the circuit board. The first and second contact portion may extend from the LED chip to an edge of the LED substrate that contacts the circuit board.

The first contact portion and the second contact portion may be co-planar with the conductive tracks of the circuit board. In this way, a good electrical connection may be provided between the first contact portion and the circuit, and the second contact portion and the circuit. In addition, as the conductive tracks and the contact portions are co-planar the connection is not bulky.

The first contact portion may contact the first conductive track of the circuit board and the second contact portion may contact the second conductive track of the circuit board. The LED substrate may comprise multiple contact portions for providing electrical contact between the circuit of the circuit board and the LED chip or multiple LED chips, for example for an LED matrix.

The LED device may further comprise a first surface mount component for electrically connecting the first contact portion to the first conductive track of the circuit board and a second surface mount component for electrically connecting the second contact portion to the second conductive track of the circuit board.

The LED device may further comprise a side wall contact portion provided on a side wall of the LED substrate for connecting the LED to a conductive track of the circuit board. The side wall contact portion may be provided along an edge of the LED substrate that is arranged to interface with the circuit board substrate, in use. The side wall may electrically connect the LED chip to the circuit of the circuit board.

The circuit board substrate may comprise: a first core layer; a bonding layer; and a second core layer, wherein the bonding layer is provided between the first core layer and the second core layer. A plurality of conductive tracks may be provided on the first core layer. The LED substrate may further comprise a third portion disposed on a bottom surface of the LED substrate opposite to the mounting surface. The third portion may have a different coefficient of thermal expansion to the LED substrate. For example, the third contact portion may be of the same material as the conductive tracks, i.e. copper, to create a symmetric structure. Since there is a mismatch between the coefficient of thermal expansion of the copper and the coefficient of thermal expansion of the LED substrate, the symmetric design reduces stress (and thus bending) of the LED substrate.

According to the invention, there is provided a method of manufacturing an LED device, comprising:

providing a circuit board substrate, the circuit board substrate comprising a stack of core layers, a pre-preg layer and copper layers, the circuit board substrate further comprising a receiving portion for receiving an LED module;

providing the LED module in the receiving portion, wherein the LED module comprises an LED chip mounted on an LED substrate; and after providing the LED module in the receiving portion, applying heat and pressure to bond the core layers of the circuit board substrate together and to integrate the LED substrate with the circuit board substrate.

By providing the LED module and circuit board in this way, the LED device is simple to manufacture. The LED substrate may be positioned within the initial circuit board substrate so that the layers of the circuit board substrate surround the LED substrate, except for the mounting surface of the LED substrate (and the bottom surface) which is exposed.

The method may further comprise: providing a copper layer on an outer surface of the circuit board substrate; providing a protective (etch stop) layer on the copper layer, wherein the protective layer defines a circuit; performing an etching step to remove parts of the copper layer that are not protected by the protective layer, wherein the remaining parts of the copper layer form a circuit comprising a plurality of conductive tracks.

The first and second core layers may be clad with a copper layer on the first surface and second surface respectively. The copper layers may be coated on the first and second core layers in a metallization step. Alternatively, the copper layers may be laminated to the circuit board substrate.

The method may further comprise providing a first contact portion and a second contact portion on a mounting surface of the LED module; and performing an electroplating step to connect a first conductive track of the circuit board to the first contact portion of the LED module and to connect the second contact portion of the LED module to a second conductive track of the circuit board.

The first contact portion and second contact portion may be arranged on the mounting surface of the LED substrate such that in the laminated structure, the first contact portion is aligned with a first conductive track of the circuit board and the second contact portion is aligned with a second conductive track of the circuit board.

The method may further comprise providing a side wall contact portion on a side wall of the LED module and performing an electroplating step to connect the side wall contact portion to a conductive track of the circuit board. The side wall contact portion may be formed by electroplating a sidewall of the LED substrate.

Alternatively, the method may further comprise:

providing a first contact portion and a second contact portion on a mounting surface of the LED module; and mounting a first surface mount component to connect a first conductive track of the circuit board to the first contact portion of the LED module and mounting a second surface mount component to connect a second contact portion of the LED module to a second conductive track of the circuit board.

The method may comprise mounting the LED chip below the outer surface of the circuit board substrate. The method may further comprise providing an optical element on the outer surface of the circuit board substrate with the LED chip below the outer surface of the circuit board substrate. Such optical element may be a light guide.

These surface mount components may function as zero ohm resistors.

BRIEF DESCRIPTION OF THE DRAWINGS

Examples of the invention will now be described in detail with reference to the accompanying drawings, in which.

DETAILED DESCRIPTION OF THE EMBODIMENTS

Figure 1:
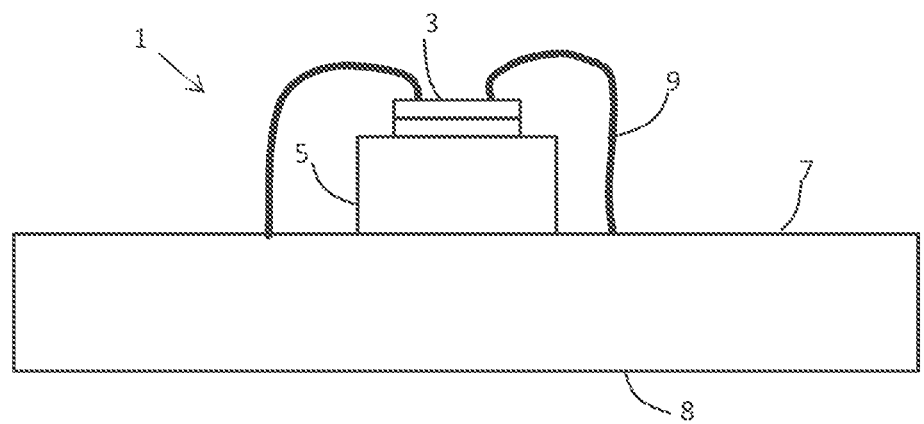
FIG. 1 shows a known LED device.

Referring to FIG. 1, there is shown a known LED device 1 in which an LED chip 3 is mounted on a heat sink portion 5 (or in general, a package or interposer), wherein the heat sink portion 5 is mounted to a top surface 7 of a circuit board substrate 8, on which conductive tracks that define a circuit are provided. By providing the heat sink portion 5 between the LED 3 and the PCB 8, the heat generated by the LED is spread through the heat sink portion before being conducted through the circuit board. As the LED 3 is mounted on top of the heat sink portion 5 the LED device 1 is not a surface mount device. Instead, in order to connect the LED 3 to the electronic circuit bond wires 9 are provided between the contacts of the LED 3 and conductive tracks of the circuit board. In another known arrangement, vias are provided through the package or interposer to connect the LED chip to the PCB instead of the wire bonds. In this way a surface mount device is provided.

The invention provides an LED device in which a substrate of an LED module is embedded in a circuit board.

Figure 2:
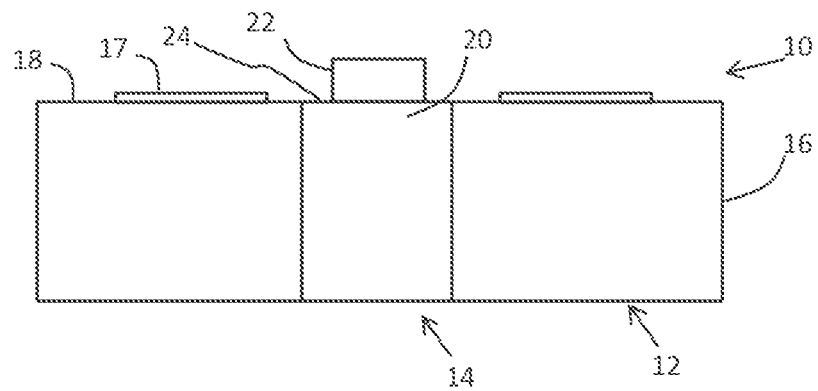
FIG. 2 shows in simplified form an LED device in accordance with an embodiment of the invention.

FIG. 2 shows in simplified form an LED device in accordance with an embodiment of the invention. The LED device 10 comprises a circuit board 12 and an LED module 14, wherein the circuit board 12 and LED module 14 co-operate with each other to provide an LED device 10 that is compact, cost efficient and has high thermal performance.

The circuit board 12 comprises a circuit board substrate 16, wherein a plurality of conductive tracks 17 is provided on a first surface 18 of the circuit board substrate 16. The conductive tracks define an electric circuit to which electronic devices may be connected. The LED module 14 comprises an LED substrate 20 for supporting an LED chip 22, and an LED chip 22 mounted on a mounting surface 24 of the LED substrate 20. When the LED device 10 is assembled, the LED substrate 20 is positioned within the circuit board substrate 16, so that the mounting surface 24 of the LED substrate 20 is co-planar with the first surface 18 of the circuit board substrate 16.

Figure 3:
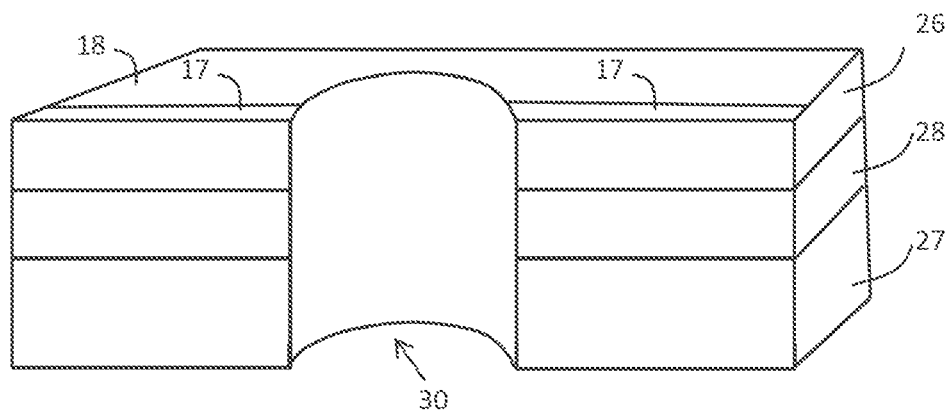
FIG. 3 shows a circuit board substrate used in the device of FIG. 2.

Referring to FIG. 3, there is shown a circuit board 12 according to an embodiment of the present invention in more detail. The circuit board substrate 16 comprises a first core layer 26, a second core layer 27 and a bonding layer 28 provided between the first core layer 26 and the second core layer 27. The bonding layer 28 is formed from a so-called pre-preg layer. The first and second core layer may be of any known material for constructing a PCB, for example FR4. The circuit board substrate 16 may be of relatively inexpensive circuit board material since as the LED substrate 14 provides heat dissipation, it is not required that the circuit board substrate 16 is particularly effective at heat dissipation. A plurality of conductive tracks 17 is provided on a first surface 18 of the circuit board substrate which is a surface of the first core layer 26 opposite to the surface of the first core layer 26 that interfaces with the bonding layer 28 and is substantially normal to the stacking direction. The conductive tracks define a first circuit.

The circuit board 12 comprises a cavity 30 for receiving the LED substrate 20 which extends through the circuit board substrate 16 such that a first cavity opening is co-planar with the first surface 18 of the circuit board substrate and a second cavity opening is co-planar with the second surface 19 of the circuit board substrate 16. The cavity 30 is shaped to receive the LED substrate.

Figure 4:
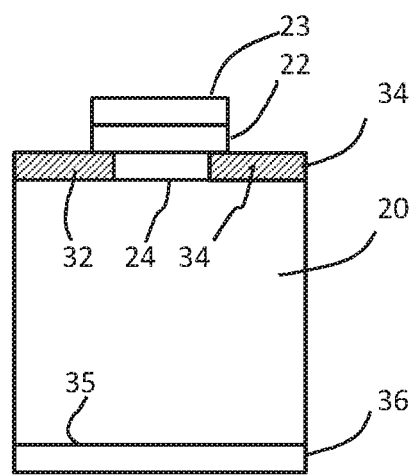
FIG. 4 shows an LED module used in the LED device of FIG. 2.

FIG. 4 shows an LED module 14 according to an embodiment of the present invention. The LED module 14 comprises an LED substrate 20. The LED substrate 20 is adapted to provide effective heat dissipation. For example, the LED substrate 20 is of Aluminum Nitride (AlN) or any other ceramic material or made of metal. An LED chip 22 is mounted on a mounting surface 24 of the LED substrate 20. A converter layer is provided on top of the LED chip. The LED chip for example comprises a blue LED chip 22, and the convertor layer 23 is a phosphor layer which is provided on the blue LED chip 22, so that the LED device 10 emits white light if a white light output is desired. Other color outputs may be desired, such as amber for a vehicle indicator light. A side-coating 21 (shown in FIG. 5) may be provided along the sides of the LED chip and convertor layer. In an example, the side coating is an over-molded side coating. A first contact portion 32 and a second contact portion 34 are mounted on the mounting surface 24 of the LED substrate 20. The first contact portion 32 may be an anode and the second contact portion 34 may be a cathode. The first and second contact portions are of metal, for example the first and second portions are of copper. The LED chip 22 is mounted on the first and second contact portions. A third contact portion 36 is provided on a bottom surface 35 of the LED substrate, opposite to the mounting surface 24.

Figure 5:
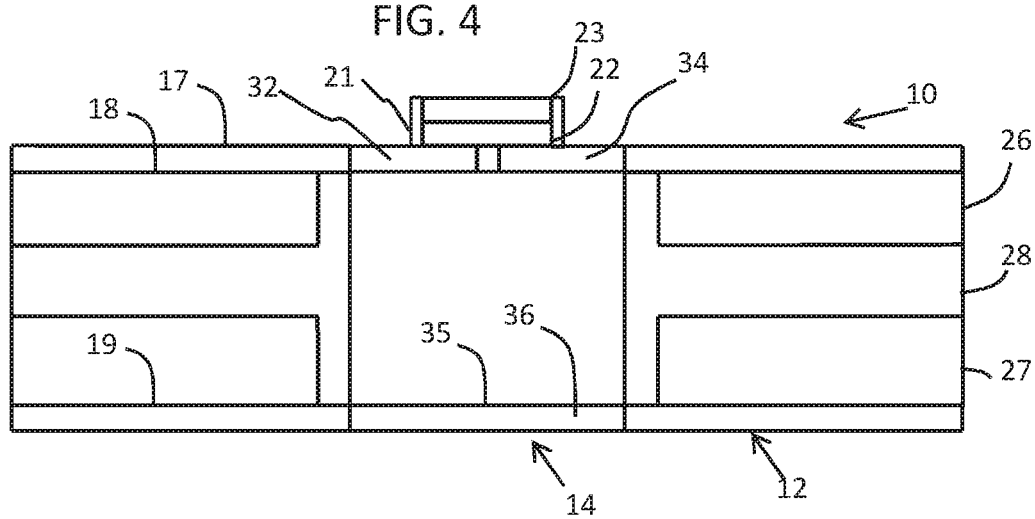
FIG. 5 shows an LED device according to an embodiment of the invention in more detail, in cross section.

FIG. 5 shows an LED device 10 according to an embodiment of the invention in more detail than in FIG. 2. The LED module 14 is received in the cavity 30 of the circuit board substrate 16, such that the mounting surface 24 of the LED substrate 20 is co-planar with the first surface 18 of the circuit board substrate 16. The conductive tracks on the circuit board substrate 16 and the first and second contact portion 32, 24 of the LED module are aligned so that the LED chip 22 is electrically connected to the electric circuit. The cavity 30 extends through the circuit board substrate 16 such that when the LED substrate 20 is positioned in the cavity 30, the bottom surface 35 of the LED substrate is co-planar with the second surface 19 of the circuit board substrate. The LED substrate 20 is held in position within the circuit board substrate 16 by the bonding layer 28.

In order to manufacture the device, a first core layer 26, a second core layer 27 and a sheet of pre-preg material 28 are provided. In a first step, an aperture is formed in each of the core layers and in the sheet of pre-preg material, for example by milling a hole in each layer.

A first copper layer 25 is provided on the first surface 18 of the first core layer and a second copper layer 29 is provided on the second surface 19 of the second core layer. The copper layers may comprise foil layers.

Subsequently, the first and second core layers and the sheet of pre-preg material are stacked, with the pre-preg layer disposed between the first and second core layers. The copper layers 25, 29 provide outer surfaces of the stack, and surfaces of the first and second core layers 26, 27 opposite to the copper clad surfaces interface with the pre-preg layer 28. When stacking the layers, each layer is positioned such that aperture of the layer is aligned with other apertures in the stack so that the openings in each of the layers co-operate with the other openings to form cavity 30 in the stacked structure. The apertures are shaped such that the cavity 30 formed by the aligned apertures is shaped to receive LED substrate 20.

Next, an LED module 14 is provided, the LED module comprising an LED substrate 20, a first contact portion 32 and a second contact portion 34 bonded to the LED substrate, and an LED chip mounted 22 to the LED substrate 20 and in contact with the first and second contact portions 32, 34.

The LED module 14 is placed in the cavity 30 of the stacked core layers, pre-preg layer and copper layers. The LED module is positioned with the LED substrate 20 in the cavity 30 so that the sidewalls of the LED substrate are surrounded by the stacked layers of the circuit board substrate (the core layers and pre-preg layer). Next, a lamination process is performed.

In the lamination step, heat and pressure are applied to the LED device to bond the first and second core layers 26, 27 of the substrate together and to integrate the LED substrate 20 with the circuit board substrate. The first and second core layers 26, 27 of the circuit board substrate are bonded by the pre-preg material 28. Initially, the viscosity of the pre-preg material is lowered so that the pre-preg material flows into voids between the layers "gluing" the stacked layers together. The pre-preg material also flows into gaps in the cavity between the LED substrate and the circuit board substrate. The pre-preg material is then cured to fix the layers together and to bond the LED substrate 20 to the circuit board substrate 16. After the lamination process and curing, the LED module is a part of the laminated board structure.

Next, a patterning step is performed. In the patterning step, a protective (etch stop) layer is formed on the first copper layer 25. The protective layer defines a routing of an electrical circuit to be provided on the PCB. At least a first conductive track and a second conductive track are formed, wherein the first conductive track is positioned to be aligned with a first contact portion 32 of the LED module and the second conductive track is positioned to be in aligned with a second contact portion of the LED module.

Following this, an etching step is performed to remove the unwanted portions of the copper layer, which are portions of the copper layer that are not covered by the protective layer. After the etching step has been performed, the protective layer is removed and the remaining copper layer provides conductive tracks 17 which form a circuit.

Finally, a further plating step is performed to bridge the connection between the tracks of the PCB and the tracks 32, 34 of the LED module.

The LED chip 22 may be covered by a temporary film, to protect the LED chip during the manufacturing process, including the lamination step, the patterning step and the etching step.

In an embodiment, the mounting surface 24 of the LED substrate 20 is clad with a copper layer. After the LED module is placed inside the cavity 30 of the circuit board substrate 16 and the lamination step is performed, the first contact portion 32 and the second contact portion 34 of the LED module are then formed in the patterning and etching step.

In an alternative embodiment, a laminated circuit board substrate including a first core layer 26, a bonding layer 28, and a second core layer 27 is provided. A first copper layer 25 is bonded to a first surface 18 of the first core layer 26 and a second copper layer 29 is bonded to the second surface 19 of the second core layer 27. A hole is milled in the circuit board substrate 16 and copper layers. The LED module is placed inside the hole, and is retained in the hole by a 'press fit' connection between the LED module and the circuit board substrate. Patterning and etching steps are then performed to define a circuit on the circuit board substrate. Finally, an electroplating step is performed to connect the contacts of the LED substrate to the circuit defined on the PCB. This version embeds the LED module in an already laminated PCB structure.

Figure 6:
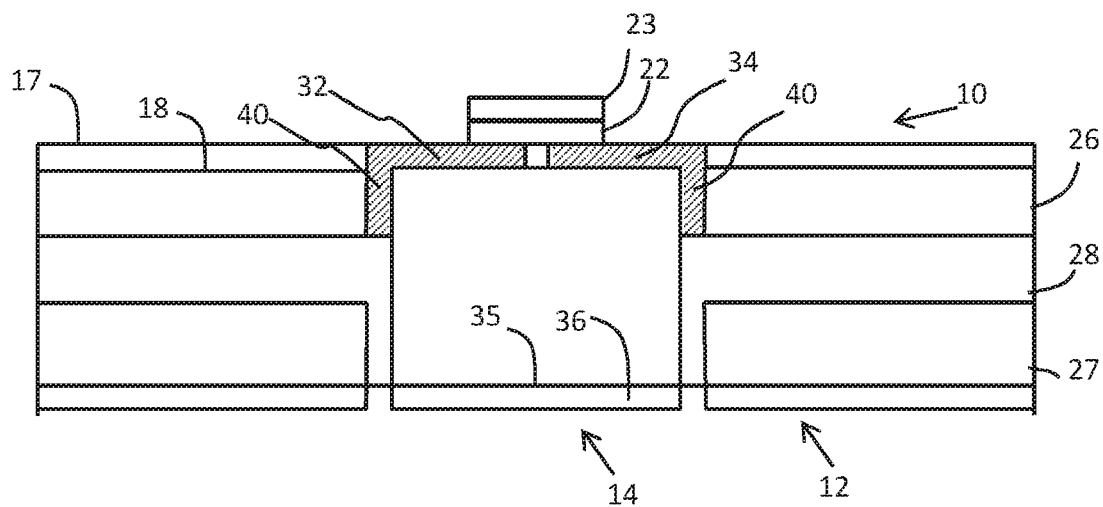
FIG. 6 shows an LED device according to another embodiment of the invention, in cross section.

FIG. 6 shows an embodiment of the invention in which the LED device 10 further comprises side wall contact portions 40. The side wall contact portions 40 extend from the first and second contact portion 32, 34 down the sides of the LED substrate, between the LED substrate 20 and the circuit board substrate 16. The side wall contact portions 40 are of copper and are arranged to provide an electrical connection between the circuit and the LED chip 22. The side wall contact portions 40 may be formed by electroplating.

Again, in order to connect the PCB tracks to the contacts of the LED module (which are then at the top and down the sides), a further electroplating step may be used.

Figure 7:
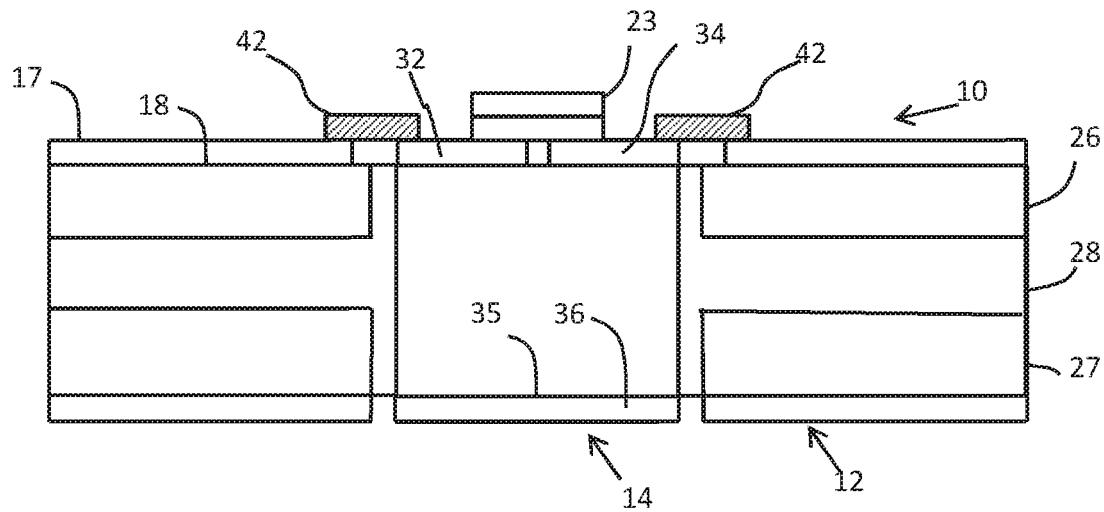
FIG. 7 shows an LED device according to another embodiment of the invention, in cross section.

FIG. 7 shows an embodiment in which the first and second contact portions 32, 34 are connected to the circuit of the circuit board 12 by surface mount components 42. The surface mount components 42 for example function as zero ohm bridging resistors.

After lamination in this case, the LED module is only mechanically connected, and there is a space between the ends of the PCB tracks and the LED contacts. The space is bridged by the surface mount components 42. This approach is for example suitable when the final PCB in any case requires surface mount components to be provided.

Figure 8:
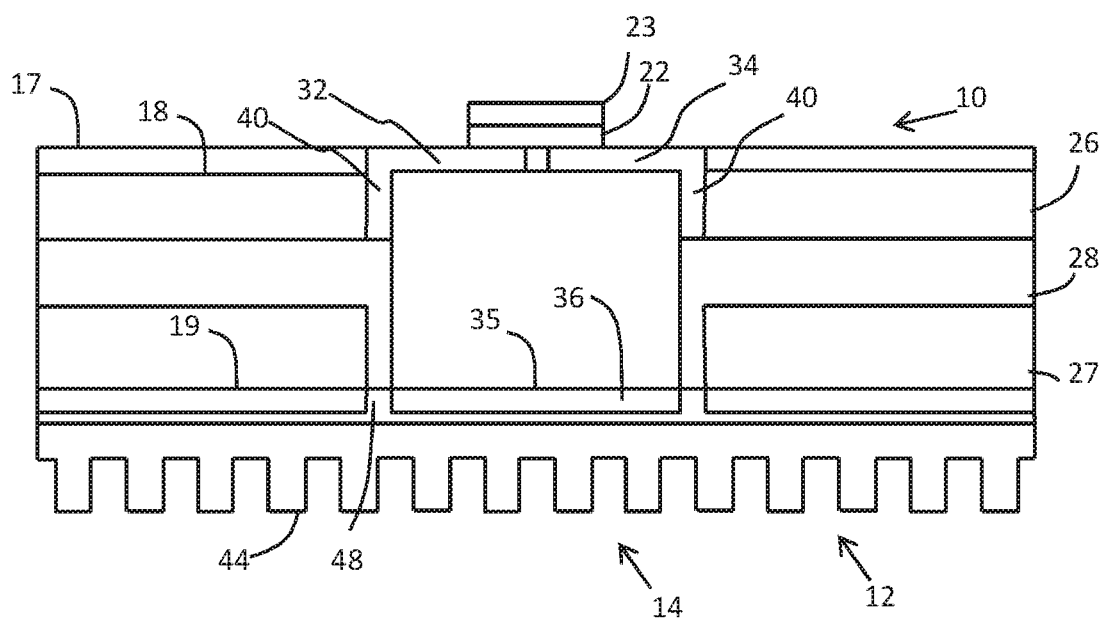
FIG. 8 shows an LED device according to another embodiment of the invention, in cross section.

FIG. 8 shows an embodiment in which the LED device 10 further comprises a heat sink portion 44. The bottom of the circuit board 12 (i.e. the second surface 19 omitting the copper layer) and a bottom 46 of the LED substrate 20 (i.e. the surface 35 omitting the conductive pad beneath) which is opposite to the mounting surface 18 are co-planar, and together they form a heat dissipation surface. A thermal interface material (TIM) layer 48 is provided between the heat dissipation surface and the heat sink portion 44. The TIM layer 48 is provided on the heat dissipation surface, covering both the bottom surface of the LED substrate 20 and the second surface of the circuit board substrate 16. The TIM layer 48 fills the space between the heat dissipation surface and the heat sink portion 44, and is arranged to conduct heat away from the LED substrate 20 to the heat sink portion 44. In this way, heat generated by the LED chip 22 is efficiently conducted through the LED substrate 20 and dissipated by the heat sink portion 44. The heat sink portion 44 comprises a plurality of fins in order to maximize the surface are of the heat sink portion, to provide effective heat dissipation. The heat sink portion 44 is attached to the heat dissipation surface by the TIM layer.

In an embodiment, the heat sink portion 44 is screwed to the circuit board substrate. Alternatively, the heat sink portion is clamped to the circuit board substrate. In this way, the heat sink portion can be easily attached to the rest of the LED device, and more easily than is possible for a ceramic.

A heat sink as shown in FIG. 8 may be applied to any of the designs described above.

Figure 9:
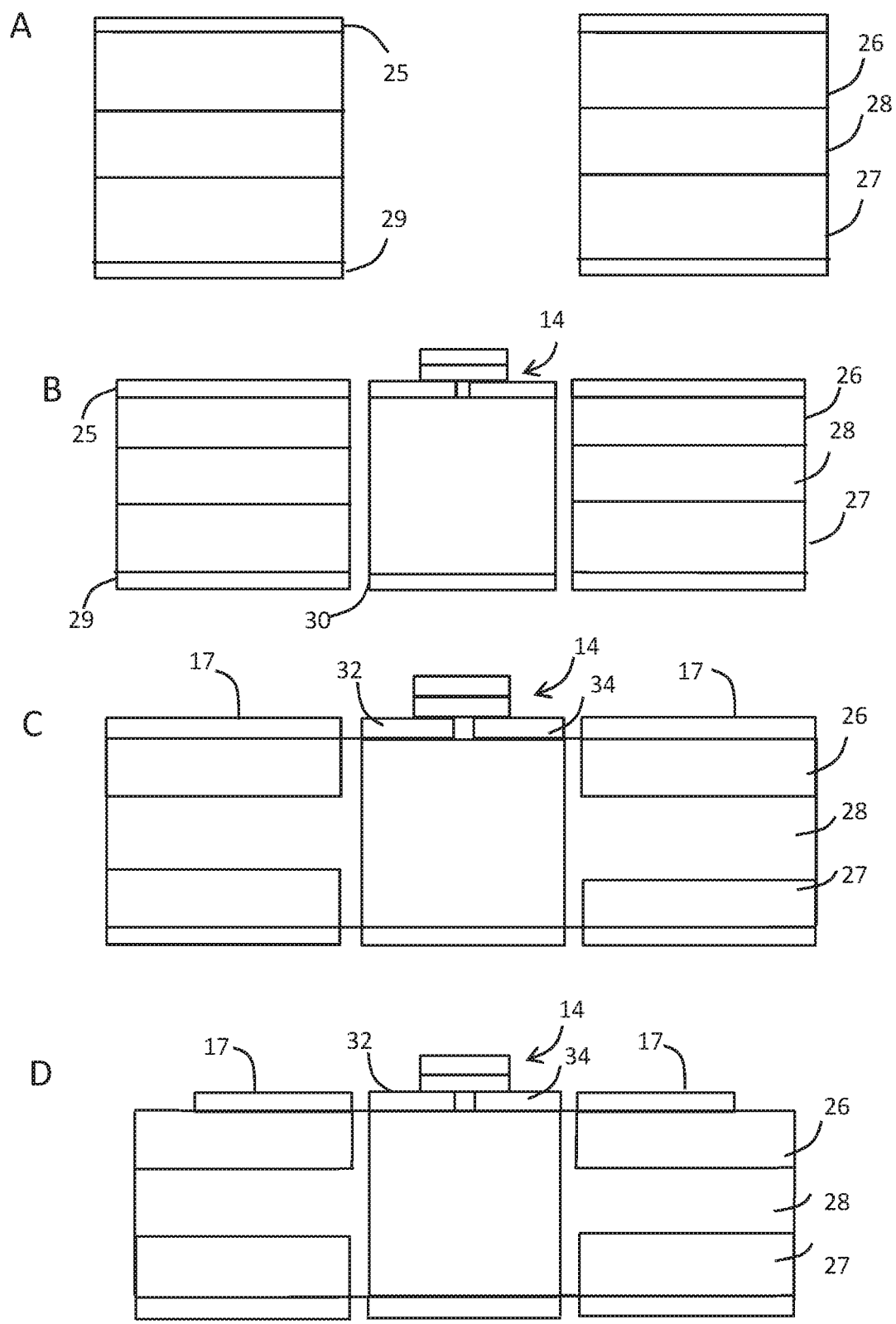
FIG. 9 illustrates a method of manufacturing an LED device, according to an embodiment of the invention.

FIG. 9 shows a method of manufacturing an LED device according to an embodiment of the invention.

FIG. 9A shows the first step of forming an aperture for receiving the LED module in the first core layer 26, the second core layer 27 and the layer of prep-preg material 28, and the copper layers 25, 29 is provided on outer surfaces of the stack. The layers are stacked with the apertures aligned.

FIG. 9B shows the LED module 14 introduced into the opening designed for it. The LED module 14 has a ceramic substrate, for example AN. There may be a single LED or multiple LEDs on the surface, for example 1 to 100 LEDs. The module 14 may be provided with a protective covering to protect the LEDs during the subsequent lamination process. The LED chip is soldered to the underlying substrate for example using eutectic gold (AuSn 80/20). This is carried out before the module is fitted, since inexpensive circuit board materials do not survive the high soldering temperatures.

The LED module may also include an over-molded side coating and/or transient voltage suppression (TVS) diodes.

FIG. 9C shows the lamination of the top and bottom core layers 26, 27. In the lamination process, the viscosity of the pre-preg material decreases due to the heat and pressure that it is subjected to. The pre-preg material flows around the layers of the circuit board substrate and the LED module 14, filling the gaps between the first and second core layers 26, 27 and gaps in the cavity 30 between circuit board substrate 16 and the LED module 14. The pre-preg material is then cured, so that it bonds the first and second core layers 26, 27 together and fixes the LED module 14 into the structure of the PCB.

The core layers are for example FR4 (Flame Retardant 4).

FIG. 9D shows the structure after the PCB tracks have been plated and etched, in conventional manner. The PCB tracks include a first conductive track that is aligned with the first LED contact portion 32 and a second conductive track that is aligned with the second LED contact portion 34. During the lamination, printing or plating and etching, the LEDs are protected by the protective covering. An electroplating step is carried out to connect the LED contact portions and the PCB tracks (not shown). Any protective covering used is removed at the end of the process.

As explained above, in some examples, electrical connections in the form of surface mount components may also be applied.

The LED device may comprise a plurality of LED chips such that the LED device is a multi-chip device. These multiple chips may be formed as part of a single module, but equally the LED device may comprise a plurality of separate LED modules integrated into the circuit board substrate. The LED substrate may comprise a plurality of (pairs of) contact portions such that each LED chip mounted on the LED substrate is individually addressable. This is of particular interest for matrix beam applications.

The LED substrate and the receiving cavity of the circuit board substrate may not be cylindrical as in the examples shown above. Instead, the LED substrate and receiving cavity may have a rectangular cross section, or a cross section of any other shape. The LED module substrate may extend fully though the PCB but it may instead be formed in recess which extends only partially through the substrate.

The LED substrate may comprise a different ceramic material to the examples given above. Alternatively, the LED substrate may be of metal. The LED substrate may comprise $Al_2O_3$. The LED substrate may be of Al and further comprise a thin isolation film.

The LED module may comprise a wafer level chip package, wherein the LED chip is part of the wafer level chip package.

The first and second core layers of the PCB may comprise any known raw material suitable for a circuit board substrate, such as FR1, bismaleimide/triazine (BT) or a composite epoxy material (CEM), or any other PCB laminate material and not only FR4 as in the example above.

The converter layer may comprise a filter for selecting a particular range of wavelengths of the light emitted by the LED chip. For example, the filter may be an orange filter such that the LED device emits orange light.

The LED device may comprise a multi-layer circuit board.

In the method of manufacture, the first and second core layer may be provided with copper layers bonded to a surface of the core layer before the aperture is formed in the first and second core layers. Alternatively the copper layer may be added to the first and second core layers after the aperture is formed, for example by laminating a copper foil.

The copper layers may instead be coated on the first and second core layers in a metallization step.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method of manufacturing an LED device, comprising:
    providing a circuit board substrate, the circuit board substrate comprising at least two core layers, a pre-preg layer comprising pre-preg material, the pre-preg layer between the at least two core layers, and a cavity, the cavity of the circuit board substrate formed from openings in the least two core layers and in the pre-preg layer;

placing an LED module in the cavity of the circuit board substrate, the LED module comprising an LED chip mounted on an LED substrate, the LED substrate extending into the cavity of the circuit board substrate; and after placing the LED module in the cavity of the circuit board substrate, applying heat and pressure to the pre-preg material allowing the pre-preg material to flow into gaps between the LED substrate and the circuit board substrate and curing the pre-preg material.

2. The method of claim 1, further comprising:

providing a copper layer on an outer surface of the circuit board substrate; and after applying heat and pressure performing an etching step to the copper layer to form a plurality of conductive tracks.

3. The method of claim 2, further comprising:

providing a first contact portion and a second contact portion on a mounting surface of the LED substrate; and after the etching step, performing an electroplating step to connect the plurality of conductive tracks to the first and second contact portions.

4. The method of claim 2, wherein the method further comprises:

providing a side wall contact portion on a side wall of the LED substrate; and performing an electroplating step to connect the side wall contact portion to the plurality of conductive tracks.

5. The method of claim 2, further comprising:

providing a first contact portion and a second contact portion on a mounting surface of the LED module; and mounting a first surface mount component to connect a first conductive track of the circuit board to the first contact portion of the LED module; and mounting a second surface mount component to connect a second contact portion of the LED module to a second conductive track of the circuit board.

6. The method of claim 1, wherein placing the LED module in the cavity comprises mounting the LED chip below an outer surface of the circuit board substrate.

7. The method of claim 6, further comprising providing an optical element on the outer surface of the circuit board substrate.

8. The method of claim 7, wherein the optical element is a light guide.

9. The method of claim 1, further comprising forming the cavity of the circuit board substrate by aligning the openings in the at least two core layers and the pre-preg layer.

\* \* \* \* \*